(12) United States Patent
Nishizawa

(10) Patent No.: US 11,220,745 B2
(45) Date of Patent: Jan. 11, 2022

(54) COATED CUTTING TOOL

(71) Applicant: TUNGALOY CORPORATION, Fukushima (JP)

(72) Inventor: Hirosato Nishizawa, Iwaki (JP)

(73) Assignee: TUNGALOY CORPORATION, Iwaki (JP)

(*) Notice: Subject to any disclaimer, the term of this patent is extended or adjusted under 35 U.S.C. 154(b) by 15 days.

(21) Appl. No.: 17/000,814

(22) Filed: Aug. 24, 2020

(65) Prior Publication Data

US 2021/0062334 A1  Mar. 4, 2021

(30) Foreign Application Priority Data

Aug. 30, 2019 (JP) .............................. JP2019-157823

(51) Int. Cl.
| | |
|---|---|
| *C23C 16/36* | (2006.01) |
| *C23C 16/34* | (2006.01) |
| *B23B 27/14* | (2006.01) |
| *B23C 5/16* | (2006.01) |
| *C23C 28/00* | (2006.01) |

(52) U.S. Cl.
CPC ............ *C23C 16/34* (2013.01); *B23B 27/148* (2013.01); *B23C 5/16* (2013.01); *C23C 28/32* (2013.01); *B23C 2224/32* (2013.01); *B23C 2226/125* (2013.01); *B23C 2228/08* (2013.01); *B23C 2228/10* (2013.01)

(58) Field of Classification Search
CPC ......... B23B 5/16; B23B 27/14; B23B 27/148; C23C 16/34; C23C 16/36

USPC .................................................. 428/336, 698
See application file for complete search history.

(56) References Cited

U.S. PATENT DOCUMENTS

| | | | | |
|---|---|---|---|---|
| 5,920,760 A | * | 7/1999 | Yoshimura | ............ C23C 30/005 428/698 |
| 2004/0161639 A1 | * | 8/2004 | Fukano | .................. C23C 30/005 428/698 |
| 2014/0017469 A1 | * | 1/2014 | Fukunaga | ............... C23C 16/36 428/216 |

FOREIGN PATENT DOCUMENTS

| | | | |
|---|---|---|---|
| JP | 2000-158205 | * | 6/2000 |
| JP | 2001-322008 | * | 11/2001 |
| JP | 2009-56538 | * | 3/2009 |
| JP | 2009-255282 A | | 11/2009 |

* cited by examiner

*Primary Examiner* — Archene A Turner
(74) *Attorney, Agent, or Firm* — Studebaker & Brackett PC

(57) ABSTRACT

A coated cutting tool comprising a substrate comprising a cubic boron nitride sintered body and a coating layer formed on the substrate, wherein the coating layer comprises a Ti carbonitride layer comprising $Ti(C_xN_{1-x})$; an average thickness of the Ti carbonitride layer is 0.5 μm or more and 5.0 μm or less; in the Ti carbonitride layer, R75 is higher than R25; in the Ti carbonitride layer, a texture coefficient TC (111) of a (111) plane is 1.0 or more and 2.0 or less; and in X-ray diffraction measurement of the Ti carbonitride layer, an absolute value of a difference between a maximum value and a minimum value of 2θ is 0.1° or less on the (111) plane when the measurement is performed at each of ψ angles of 0°, 30°, 50° and 70°.

20 Claims, 1 Drawing Sheet

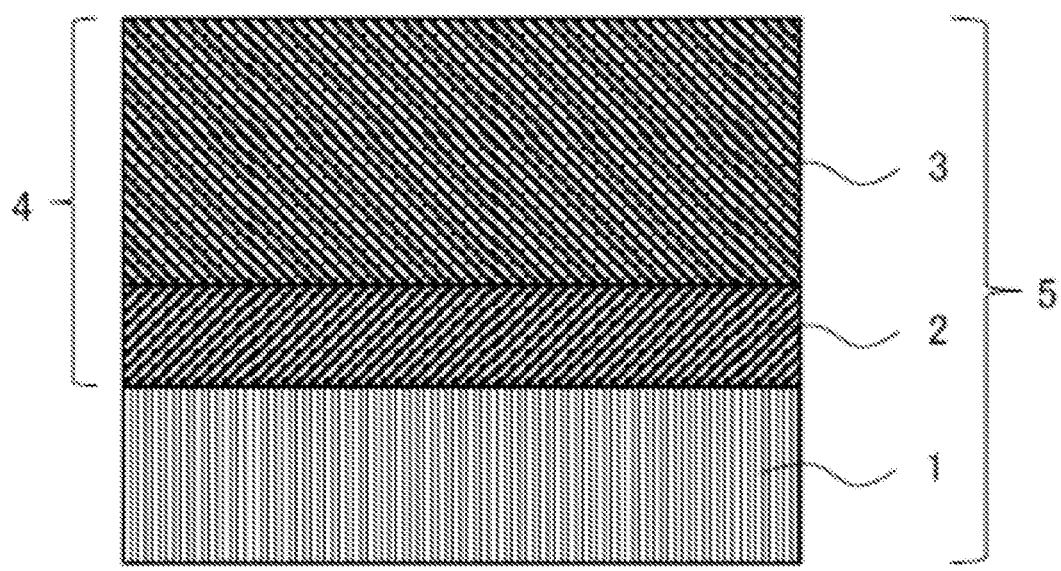

COATED CUTTING TOOL

TECHNICAL FIELD

The present invention relates to a coated cutting tool.

BACKGROUND ART

Cubic boron nitride sintered bodies have been conventionally used as cutting tools for machining quenched steel, heat-resistant alloys and the like because such bodies have high hardness and excellent thermal conductivity. In recent years, coated cubic boron nitride sintered body tools comprising a substrate made of a cubic boron nitride sintered body and a coating layer coated on the surface of the substrate have been used as cutting tools in order to improve machining efficiency.

Various techniques have been proposed to improve the properties of such coating layers. For example, Patent Publication JP-A-2009-255282 proposes a cutting tool made of a coated cubic boron nitride sintered material in which a coating layer consisting of a lower layer consisting of a composite nitride layer of titanium and aluminum, a first intermediate layer consisting of a titanium nitride layer, a second intermediate layer consisting of a titanium carbonitride layer, and an upper layer consisting of a titanium nitride layer is formed by vapor deposition on a surface of a substrate consisting of a cubic boron nitride-based sintered material.

SUMMARY

Technical Problem

An increase in speed, feed and depth of cut has become more conspicuous in cutting in recent times, and fracture resistance of a tool are required to be further improved compared to those involved in the prior art. In particular, the number of cutting processes in which a load is applied to a coated cutting tool, as in cutting of quenched steels, heat-resistant alloys and the like, has increased. The adhesion of the coating layer to the substrate in the conventional coated cutting tool is insufficient under such severe cutting conditions, which causes peeling and results in fractures, so that the tool life is difficult to extend.

The cutting tool disclosed in Patent Publication JP-A-2009-255282 does not necessarily have sufficient fracture resistance under high-speed cutting conditions, and particularly, under conditions where hard-to-cut materials such as quenched steel, heat-resistant alloys, and the like are machined at a high speed, the adhesion of the coating layer to the substrate is insufficient.

The present invention has been made in light of the above circumstances, and it is an object thereof to provide a coated cutting tool having excellent wear resistance and fracture resistance and which accordingly allows for an extended tool life.

Solution to Problem

The inventors of the present invention have conducted extensive research on the extension of tool life of coated cutting tools, and have found that where the coated cutting tool is configured as described hereinbelow, the adhesion between the substrate and the coating layer is improved, thereby making it possible to improve the fracture resistance and consequently making it possible to extend the tool life of the coated cutting tool, and the present invention has been completed based on this finding.

That is, the gist of the present invention is as follows.

[1]

A coated cutting tool comprising a substrate consisting of a cubic boron nitride sintered body and a coating layer formed on the substrate, wherein the coating layer comprises a Ti carbonitride layer consisting of a composition represented by a following formula (i), $$Ti(C_xN_{1-x}) \qquad (i)$$

in the formula, x represents an atomic ratio of the C element to a total of the C element and the N element at a position where a thickness is 50% from the substrate side in the Ti carbonitride layer, and satisfies $0.1<x<0.5$;

an average thickness of the Ti carbonitride layer is 0.5 μm or more and 5.0 μm or less;

in the Ti carbonitride layer, an atomic ratio R75 of the C element to a total of the C element and the N element at a position where a thickness is 75% from the substrate side is higher than an atomic ratio R25 of the C element to a total of the C element and the N element at a position where a thickness is 25% from the substrate side;

in the Ti carbonitride layer, a texture coefficient TC (111) of a (111) plane represented by a following formula (1) is 1.0 or more and 2.0 or less; and in X-ray diffraction measurement of the Ti carbonitride layer, an absolute value of a difference between a maximum value and a minimum value of 2θ represented by a following formula (2) is 0.1° or less on the (111) plane when the measurement is performed at each of ψ angles of 0°, 30°, 50° and 70°.

$$TC(111) = \frac{I(111)}{I_0(111)} \left\{ \frac{1}{6} \Sigma \frac{I(hkl)}{I_0(hkl)} \right\}^{-1} \qquad (1)$$

in the formula (1), I(hkl) represents a peak intensity of an (hkl) plane in X-ray diffraction of the Ti carbonitride layer, $I_0$(hkl) represents a standard diffraction intensity of the (hkl) plane in an ICDD card number 00-042-1488, and (hkl) indicates six crystal planes of (111), (200), (220), (311), (420), (422).

Absolute value of the difference between the maximum value and the minimum value of 2θ=|2θ max−2θ min| (2)

in the formula (2), 2θ max represents a maximum value among peak positions 2θ of a crystal plane when the ψ angle is 0°, 30°, 50°, and 70°, and 2θ min represents a minimum value among peak positions 2θ of the crystal plane when the ψ angle is 0°, 30°, 50°, and 70°.

[2]

The coated cutting tool according to [1], wherein in the X-ray diffraction measurement of the Ti carbonitride layer, an absolute value of a difference between a maximum value and a minimum value of 2θ represented by the formula (2) is 0.1° or less on a (200) plane when the measurement is performed at each of ψ angles of 0°, 30°, 50° and 70°.

[3]

The coated cutting tool according to [1] or [2], wherein in the Ti carbonitride layer, a difference (R75-R25) between the atomic ratio R75 of the C element to a total of the C element and the N element at a position where a thickness is 75% from the substrate side and the atomic ratio R25 of the C element to a total of the C element and the N element at a position where a thickness is 25% from the substrate side is 0.1 or more and 0.3 or less.

[4]

The coated cutting tool according to any one of [1] to [3], wherein the coating layer has a lower layer between the substrate and the Ti carbonitride layer;

the lower layer is a single layer of at least one selected from the group consisting of a following metal layer:

the metal layer consisting of a metal element of at least one selected from the group consisting of Ti, Zr, Hf, V, Nb, Ta, Cr, Mo, W, Al, Si, and Y, and a following compound layer:

the compound layer consisting of a metal element of at least one selected from the group consisting of Ti, Zr, Hf, V, Nb, Ta, Cr, Mo, W, Al, Si, and Y, and an element of at least one selected from the group consisting of C, N, O, and B, or a laminate thereof; and an average thickness of the lower layer is 0.1 μm or more and 5.0 μm or less.

[5]

The coated cutting tool according to any one of [1] to [3], wherein the coating layer has a lower layer between the substrate and the Ti carbonitride layer;

the lower layer has an alternating laminate structure in which a first compound layer having a composition represented by a following formula (I) and a second compound layer having a composition represented by a following formula (II) are alternately layered two or more times;

an average thickness of the first compound layer is 2 nm or more and 500 nm or less; and an average thickness of the second compound layer is 2 nm or more and 500 nm or less.

$$(Ti_yAl_{1-y})N \qquad (I)$$

in the formula, y represents an atomic ratio of the Ti element to a total of the Ti element and the Al element, and satisfies $0.1<y<0.5$.

$$(Ti_zAl_{1-z})N \qquad (II)$$

in the formula, z represents an atomic ratio of the Ti element to a total of the Ti element and the Al element, and satisfies $0.5 \le z \le 0.8$.

[6]

The coated cutting tool according to any one of [1] to [5], wherein an average thickness of the entire coating layer is 1.5 μm or more and 8.0 μm or less.

Advantageous Effects of Invention

The effect exerted by the coated cutting tool of the present invention is that since the coating tool excels in wear resistance and fracture resistance, the tool life is longer than in the prior art.

BRIEF DESCRIPTION OF DRAWINGS

The FIGURE is a schematic view showing an example of a coated cutting tool of the present invention.

DESCRIPTION OF EMBODIMENTS

Hereinafter, an embodiment for carrying out the present invention (hereinafter, simply referred to as "the present embodiment") will be described in detail, but the present invention is not limited to the present embodiment. The present invention can be variously modified without departing from the gist thereof. In addition, in the drawings, positional relationships such as up, down, left, and right are based on the positional relationships shown in the drawings unless otherwise specified. Further, the dimensional ratios in the drawings are not limited to the illustrated ratios.

The coated cutting tool of the present embodiment includes a substrate consisting of a cubic boron nitride sintered body and a coating layer formed on the substrate, wherein the coating layer has a Ti carbonitride layer consisting of a composition represented by the following formula (i), $$Ti(C_xN_{1-x}) \qquad (i)$$

in the formula, x represents an atomic ratio of the C element to a total of the C element and the N element at a position where a thickness is 50% from the substrate side in the Ti carbonitride layer, and satisfies $0.1<x<0.5$;

in the Ti carbonitride layer, an atomic ratio of the C element to a total of the C element and the N element at a position where a thickness is 75% from the substrate side (hereinafter also referred to as "R75") is higher than an atomic ratio of the C element to a total of the C element and the N element at a position where a thickness is 25% from the substrate side (hereinafter also referred to as "R25");

in the Ti carbonitride layer, a texture coefficient TC (111) of a (111) plane represented by the following formula (1) is 1.0 or more and 2.0 or less; and in X-ray diffraction measurement of the Ti carbonitride layer, an absolute value of a difference between a maximum value and a minimum value of 2θ represented by the following formula (2) is 0.1° or less on the (111) plane when the measurement is performed at each of ψ angles of 0°, 30°, 50° and 70°.

$$TC(111) = \frac{I(111)}{I_0(111)}\left\{\frac{1}{6}\Sigma\frac{I(hkl)}{I_0(hkl)}\right\}^{-1} \qquad (1)$$

in the formula (1), I(hkl) represents a peak intensity of an (hkl) plane in X-ray diffraction of the Ti carbonitride layer, $I_0$(hkl) represents a standard diffraction intensity of the (hkl) plane in an ICDD card number 00-042-1488, and (hkl) indicates six crystal planes of (111), (200), (220), (311), (420), (422).

Absolute value of the difference between the maximum value and the minimum value of 2θ=|2θ max−2θ min| (2)

in the formula (2), 2θ max represents a maximum value among peak positions 2θ of a crystal plane when the ψ angle is 0°, 30°, 50°, and 70°, and 2θ min represents a minimum value among peak positions 2θ of the crystal plane when the ψ angle is 0°, 30°, 50°, and 70°.

In the coated cutting tool of the present embodiment, since the substrate is a cubic boron nitride-containing sintered body, the cutting tool has excellent wear resistance and fracture resistance in the machining of, for example, quenched steels and heat-resistant alloys. Further, in the coated cutting tool of the present embodiment, where at least one layer of the coating layer has a Ti carbonitride layer having a composition represented by the formula (i), the wear resistance is improved. Further, when the atomic ratio x of the C element in the above formula (i) exceeds 0.1, the hardness of the Ti carbonitride layer is improved. As a result, the coated cutting tool of the present embodiment has improved wear resistance. Meanwhile, where the atomic ratio x of the C element in the above formula (i) is less than 0.5, the toughness of the Ti carbonitride layer is improved. As a result, the coated cutting tool of the present embodiment has improved fracture resistance. Furthermore, when the average thickness of the Ti carbonitride layer is 0.5 μm or more, the effect of having the Ti carbonitride layer is exhibited, and the wear resistance of the coated cutting tool is improved. Meanwhile, when the average thickness of the Ti carbonitride layer is 5.0 μm or less, the adhesion is improved, and thus the occurrence of peeling can be suppressed. As a result, the coated cutting tool of the present embodiment has improved fracture resistance. Further, where the texture coefficient TC (111) of the (111) plane represented by the formula (1) is 1.0 or more in the Ti carbonitride layer, the (111) plane is the close-packed plane and therefore the ratio thereof is increased, thereby increasing the hardness. As a result, the coated cutting tool of the present embodiment has improved wear resistance. Meanwhile, where the texture coefficient TC (111) represented by the formula (1) is 2.0 or less in the Ti carbonitride layer, the toughness is excellent. As a result, the coated cutting tool of the present embodiment has improved fracture resistance. Further, in the Ti carbonitride layer, where R75 is set higher than R25, the strain between the substrate and the lower layer is prevented from increasing, thereby making it possible to improve the adhesion and increase the hardness of the surface side. As a result, the coated cutting tool of the present embodiment has improved fracture resistance and wear resistance. Further, in X-ray diffraction measurement of the Ti carbonitride layer, where the absolute value of the difference between the maximum value and the minimum value of 2θ represented by the formula (2) is 0.1° or less on the (111) plane when the measurement is performed at each of ψ angles of 0°, 30°, 50° and 70°, the Ti carbonitride layer has a low anisotropic strain. Where the anisotropic strain is lowered, the occurrence of surface fractures and slippage can be suppressed, so that the adhesion between the Ti carbonitride layer and the substrate or the lower layer is improved. As a result, the coated cutting tool of the present embodiment has improved fracture resistance. It is considered that due to the combination of these features, the coated cutting tool of the present embodiment has improved wear resistance and fracture resistance, and as a result, the tool life can be extended.

The FIGURE is a schematic sectional view showing an example of the coated cutting tool of the present embodiment. A coated cutting tool 5 includes a substrate 1 and a coating layer 4 formed on the substrate surface 1, and the coating layer 4 includes a lower layer 2 and a Ti carbonitride layer 3 layered in this order in an upward direction. However, the coated cutting tool of the present embodiment is not limited to such a configuration as long as the coating layer includes at least the Ti carbonitride layer. For example, in the coated cutting tool of the present embodiment, the coating layer may include only the abovementioned Ti carbonitride layer, or a below-described lower layer in addition thereto.

The coated cutting tool of the present embodiment includes a substrate consisting of a cubic boron nitride sintered body and a coating layer formed on the substrate. Since the substrate of the coated cutting tool of the present embodiment consists of a cubic boron nitride-containing sintered body, the coating tool has excellent wear resistance and fracture resistance in the machining of, for example, quenched steels or heat-resistant alloys.

In the coated cutting tool of the present embodiment, it is preferable that the cubic boron nitride-containing sintered body comprises 65% by volume or more and 85% by volume or less of cubic boron nitride and 15% by volume or more and 35% by volume or less of a binder phase. Where the cubic boron nitride-containing sintered body in the coated cutting tool of the present embodiment contains cubic boron nitride at 65% by volume or more and the binder phase at 35% by volume or less, the fracture resistance tends to be improved. Meanwhile, where the cubic boron nitride-containing sintered body in the coated cutting tool of the present embodiment contains cubic boron nitride at 85% by volume or less and the binder phase at 15% by volume or more, the wear resistance tends to be improved.

In the coated cutting tool of the present embodiment, the binder phase preferably contains a metal element of at least one selected from the group consisting of Ti (titanium), Zr (zirconium), Hf (hafnium), V (vanadium), Nb (niobium), Ta (tantalum), Cr (chromium), Mo (molybdenum), W (tungsten), Al (aluminum), and Co (cobalt). Alternatively, the binder phase preferably contains a compound consisting of a metal element of at least one selected from the group consisting of Ti, Zr, Hf, V, Nb, Ta, Cr, Mo, W, Al, and Co, and an element of at least one selected from the group consisting of C (carbon), N (nitrogen), O (oxygen), and B (boron). Where the binder phase contains such a compound, the coated cutting tool of the present embodiment tends to have an excellent balance between the wear resistance and the fracture resistance.

Ti Carbonitride Layer

In the coated cutting tool of the present embodiment, at least one layer of the coating layer includes a Ti carbonitride layer having a composition represented by the following formula (i).

$$Ti(C_xN_{1-x}) \qquad (i)$$

in the formula, x represents an atomic ratio of the C element to a total of the C element and the N element at a position where a thickness is 50% from the substrate side in the Ti carbonitride layer, and satisfies 0.1<x<0.5.

Where at least one layer of the coating layer includes a Ti carbonitride layer having a composition represented by the above formula (i) in the coated cutting tool of the present embodiment, the wear resistance is improved. Further, where the atomic ratio x of the C element in the above formula (i) exceeds 0.1, the hardness of the Ti carbonitride layer is improved. As a result, the coated cutting tool of the present embodiment has improved wear resistance. Meanwhile, where the atomic ratio x of the C element in the above formula (i) is less than 0.5, the toughness of the Ti carbonitride layer is improved. As a result, the coated cutting tool of the present embodiment has improved fracture resistance. From the same viewpoint, the atomic ratio x of the C element in the above formula (i) preferably satisfies 0.15<x<0.48, more preferably 0.2<x<0.45, and even more preferably 0.21<x<0.44.

In the coated cutting tool of the present embodiment, for example, where the composition of the coating layer is expressed as $Ti(C_{0.35}N_{0.65})$, it indicates that the atomic ratio of the C element to a total of the C element and the N element is 0.35, and the atomic ratio of the N element to a total of the C element and the N element is 0.65. That is, it means that the amount of the C element based on a total of the C element and the N element is 35 atom %, and the amount of the N element based on a total of the C element and the N element is 65 atom %.

Further, in the Ti carbonitride layer of the coated cutting tool of the present embodiment, the atomic ratio of the C element to the total of the C element and the N element at a position where a thickness is 75% from the substrate side (hereinafter also referred to as "R75") is higher than the atomic ratio of the C element to the total of the C element and the N element at a position where a thickness is 25% from the substrate side (hereinafter also referred to as "R25"). Where R75 is set higher than R25 in the Ti carbonitride layer, the strain between the Ti carbonitride layer and the substrate or the lower layer is prevented from increasing, so that the adhesion can be improved and the hardness on the surface side can be increased. As a result, the coated cutting tool of the present embodiment has improved fracture resistance and wear resistance.

Further, in the Ti carbonitride layer of the coated cutting tool of the present embodiment, the difference (R75−R25) between the atomic ratio R75 of the C element to the total of the C element and the N element at a position where a thickness is 75% from the substrate side and the atomic ratio R25 of the C element to the total of the C element and the N element at a position where a thickness is 25% from the substrate side is preferably 0.1 or more and 0.3 or less. Where the difference (R75−R25) in the atomic ratio of the C element in the Ti carbonitride layer is 0.1 or more, the abovementioned effect of improving the adhesion and effect of improving the wear resistance tend to be further enhanced. Meanwhile, where the difference (R75−R25) in the atomic ratio of the C element is 0.3 or less, the strain in the Ti carbonitride layer can be suppressed to a low level. As a result, the coated cutting tool of the present embodiment tends to have further improved fracture resistance.

In the present embodiment, the atomic ratio of each element in the Ti carbonitride layer can be measured by the method described in Examples below. In addition, in the present embodiment, "positions where the thickness is 25%, 50%, and 75% from the substrate side" means measurement positions at 25%, 50% and 75% in this order from the substrate side towards the surface based on a thickness of 100% of the Ti carbonitride layer. (The positions means, in the Ti carbonitride layer, 25%, 50%, and 75% from interface I1 between the Ti carbonitride layer and the adjacent layer on the substrate side or the substrate if interface I1 is set to 0% and the interface on the opposite side to interface I1 is set to 100%.)

The average thickness of the Ti carbonitride layer in the coated cutting tool of the present embodiment is 0.5 μm or more and 5.0 μm or less. Where the average thickness of the Ti carbonitride layer is 0.5 μm or more, the effect of having the Ti carbonitride layer is exhibited, and the wear resistance of the coated cutting tool is improved. Meanwhile, where the average thickness of the Ti carbonitride layer is 5.0 μm or less, the adhesion is improved, and thus the occurrence of peeling can be suppressed. As a result, the coated cutting tool of the present embodiment has improved fracture resistance. From the same viewpoint, the average thickness of the Ti carbonitride layer is preferably 0.8 μm or more and 4.8 μm or less, and more preferably 1.0 μm or more and 4.7 μm or less.

Further, in the Ti carbonitride layer, the texture coefficient TC (111) of a (111) plane represented by the following formula (1) is 1.0 or more and 2.0 or less; and $$TC(111) = \frac{I(111)}{I_0(111)} \left\{ \frac{1}{6} \sum \frac{I(hkl)}{I_0(hkl)} \right\}^{-1} \quad (1)$$

in the formula (1), I(hkl) represents a peak intensity of an (hkl) plane in X-ray diffraction of the Ti carbonitride layer, $I_0$(hkl) represents a standard diffraction intensity of the (hkl) plane in an ICDD card number 00-042-1488, and (hkl) indicates six crystal planes of (111), (200), (220), (311), (420), (422).

Where the texture coefficient TC (111) of the (111) plane represented by the above formula (1) is 1.0 or more in the Ti carbonitride layer, the (111) plane is the close-packed plane and therefore the ratio thereof is increased, thereby increasing the hardness. As a result, the coated cutting tool of the present embodiment has improved wear resistance. Meanwhile, where the texture coefficient TC (111) represented by the formula (1) is 2.0 or less in the Ti carbonitride layer, the toughness is excellent. As a result, the coated cutting tool of the present embodiment has improved fracture resistance. From the same viewpoint, the texture coefficient TC (111) of the (111) plane represented by the above formula (1) is preferably 1.1 or more and 1.9 or less, and more preferably 1.2 or more and 1.9 or less.

In the present embodiment, the texture coefficient TC (111) of the (111) plane of the Ti carbonitride layer can be calculated as follows. For the coated cutting tool, X-ray diffraction measurement with a 2θ/θ concentrated optical system using a Cu-Kα ray is performed under the conditions of the output: 50 kV, 250 mA, incident side solar slit: 5°, divergence vertical slit: 2/3°, divergence vertical restriction slit: 5 mm, scattering slit: 2/3°, light receiving side solar slit: 5°, light receiving slit: 0.3 mm, BENT monochromator, light receiving monochromatic slit: 0.8 mm, sampling width: 0.01°, scan speed: 4°/min, and 2θ measurement range: 25° to 140°. As the apparatus, an X-ray diffractometer manufactured by Rigaku Corporation (model "RINT TTR III") can be used. The peak intensity of each crystal plane of the Ti carbonitride layer or the like is obtained from the X-ray diffraction pattern. From the obtained peak intensity of each crystal plane, the texture coefficient TC (111) of the (111) plane in the Ti carbonitride layer or the like is calculated from the above formula (1).

Further, in the coated cutting tool of the present embodiment, in X-ray diffraction measurement of the Ti carbonitride layer, an absolute value of a difference between a maximum value and a minimum value of 2θ represented by a following formula (2) (hereinbelow simply referred to as "the absolute value of the difference between the maximum value and the minimum value of 2θ") is 0.1° or less on the (111) plane when the measurement is performed at each of ψ angles of 0°, 30°, 50° and 70°.

Absolute value of the difference between the maximum value and the minimum value of 2θ=|2θ max−2θ min|　　(2)

in the formula (2), 2θ max represents a maximum value among peak positions 2θ of a crystal plane when the ψ angle is 0°, 30°, 50°, and 70°, and 2θ min represents a minimum value among peak positions 2θ of the crystal plane when the ψ angle is 0°, 30°, 50°, and 70°.

Where the absolute value of the difference between the maximum value and the minimum value of 2θ is 0.1° or less on the (111) plane in the X-ray diffraction measurement of the Ti carbonitride layer, a low anisotropic strain of the Ti carbonitride layer is demonstrated. Where the anisotropic strain is lowered, the occurrence of surface fractures and slippage can be suppressed, so that the adhesion between the Ti carbonitride layer and the substrate or the lower layer is improved. As a result, the coated cutting tool of the present embodiment has improved fracture resistance. From the same viewpoint, the absolute value of the difference between the maximum value and the minimum value of 2θ of the (111) plane is preferably 0.09° or less, and more preferably 0.08° or less. The lower limit of the absolute value of the difference between the maximum value and the minimum value of 2θ of the (111) plane is not particularly limited, but is, for example, 0° or more.

Further, in the coated cutting tool of the present embodiment, in X-ray diffraction measurement of the Ti carbonitride layer, an absolute value of a difference between a maximum value and a minimum value of 2θ represented by the formula (2) is 0.1° or less on the (200) plane when the measurement is performed at each of ψ angles of 0°, 30°, 50° and 70°.

Where the absolute value of the difference between the maximum value and the minimum value of 2θ is 0.1° or less on the (200) plane in the X-ray diffraction measurement of the Ti carbonitride layer, a low anisotropic strain of the Ti carbonitride layer is demonstrated. Where the anisotropic strain is lowered, the occurrence of surface fractures and slippage can be suppressed, so that the adhesion between the Ti carbonitride layer and the substrate or the lower layer is improved. As a result, the coated cutting tool of the present embodiment has improved fracture resistance. From the same viewpoint, the absolute value of the difference between the maximum value and the minimum value of 2θ of the (200) plane is preferably 0.09° or less. The lower limit of the absolute value of the difference between the maximum value and the minimum value of 2θ of the (200) plane is not particularly limited, but is, for example, 0° or more.

The absolute value of the difference between the maximum value and the minimum value of 2θ in the X-ray diffraction measurement of the Ti carbonitride layer in the present embodiment is measured as follows. As the measuring device, an X-ray diffraction analyzer equipped with a two-dimensional detector can be used. The X-ray tube is Cu-Kα, and the measurement is 2θ-ψ measurement. Frame measurement is performed at 10° intervals in the range of ψ angle of 0° to 70° with respect to the peak position of the (111) plane or the (200) plane of the Ti carbonitride layer. In the measurement per one frame, the measurement time is adjusted so that the intensity count from the crystal plane ((111) plane or (200) plane) is 2 times to 3 times the background. Since the intensity varies depending on the layer thickness and the like, the time is adjusted for each sample. The analysis can specify the peak position 2θ of the (111) plane and the (200) plane by using software provided with the X-ray diffraction analyzer. The absolute value of the difference between the maximum value and the minimum value of 2θ represented by the following formula (2) is calculated when the measurement is performed at each of ψ angles of 0°, 30°, 50° and 70°.

Absolute value of the difference between the maximum value and the minimum value of 2θ=|2θ max−2θ min| (2)

in the formula (2), 2θmax represents a maximum value among peak positions 2θ of the crystal plane ((111) plane or (200) plane) when the ψ angle is 0°, 30°, 50°, and 70°, and 2θ min represents a minimum value among peak positions 2θ of the crystal plane ((111) plane or (200) plane) when the ψ angle is 0°, 30°, 50°, and 70°.

Lower Layer

In the coated cutting tool of the present embodiment, the coating layer preferably includes a lower layer between the substrate and the Ti carbonitride layer. Where the coating layer includes a lower layer between the substrate and the Ti carbonitride layer, the coated cutting tool tends to have further improved wear resistance and fracture resistance.

The lower layer preferably includes a single layer or a stack of layers of at least one selected from the group consisting of a following metal layer and a following compound layer. Where the lower layer includes a single layer or a stack of layers of at least one selected from the group consisting of a following metal layer and a following compound layer, the wear resistance and fracture resistance of the coated cutting tool tend to be further improved.

Metal Layer

The metal layer consisting of a metal element of at least one selected from the group consisting of Ti, Zr, Hf, V, Nb, Ta, Cr, Mo, W, Al, Si, and Y.

Compound Layer

The compound layer consisting of a metal element of at least one selected from the group consisting of Ti, Zr, Hf, V, Nb, Ta, Cr, Mo, W, Al, Si, and Y, and an element of at least one selected from the group consisting of C, N, O, and B.

More preferably, the metal layer consists of a metal element of at least one selected from the group consisting of Ti and W.

More preferably, the compound layer consists of a metal element of at least one selected from the group consisting of Ti, Cr, Mo, W, Al and Si, and N.

Among them, where the lower layer is a nitride layer, the effect of lowering the strain in the lower layer and the Ti carbonitride layer can be obtained.

The lower layer preferably includes an alternating laminate structure in which a first compound layer having a composition represented by a following formula (I) and a second compound layer having a composition represented by a following formula (II) are alternately layered two or more times. Where the lower layer includes such an alternating laminate structure, cracks generated in the coating layer during cutting are likely to be prevented from propagating to the substrate.

$(Ti_yAl_{1-y})N$ (I)

in the formula, y represents an atomic ratio of the Ti element to a total of the Ti element and the Al element, and satisfies 0.1<y<0.5.

$(Ti_zAl_{1-z})N$ (II)

in the formula, z represents an atomic ratio of the Ti element to a total of the Ti element and the Al element, and satisfies 0.5≤z≤0.8.

The average thickness of the first compound layer is preferably 2 nm or more and 500 nm or less, more preferably 3 nm or more and 400 nm or less, and further preferably 5 nm or more and 300 nm or less.

The average thickness of the second compound layer is preferably 2 nm or more and 500 nm or less, more preferably 3 nm or more and 400 nm or less, and further preferably 5 nm or more and 300 nm or less.

In the alternate layered structure of the lower layer, the number of repetitions of the first compound layer and the second compound layer is 2 or more, preferably 4 to 100. In addition, in the present embodiment, where the first compound layer and the second compound layer are formed each one time, the "number of repetitions" is one.

In the coated cutting tool according to the present embodiment, the lower layer preferably has an average thickness of 0.1 μm or more and 5.0 μm or less. Where the average thickness of the lower layer is 0.1 μm or more, the substrate surface can be uniformly covered, so that the adhesion between the substrate and the coating layer is improved.

Therefore, the coated cutting tool of the present embodiment has improved fracture resistance. Meanwhile, where the average thickness of the lower layer is 5.0 μm or less, it is possible to prevent the strength of the lower layer from decreasing, and therefore the coated cutting tool of the present embodiment has improved fracture resistance. Within this range, from the same viewpoint as above, the average thickness of the lower layer is preferably 0.3 μm or more and 4.5 μm or less, and more preferably 1.0 μm or more and 4.5 μm or less.

In the coated cutting tool of the present embodiment, the average thickness of the entire coating layer is preferably 1.5 μm or more and 8.0 μm or less. Where the average thickness of the entire coating layer is 1.5 μm or more, the wear resistance tends to be further improved. Meanwhile, where the average thickness of the entire coating layer is 8.0 μm or less, the fracture resistance tends to be further improved. From the same viewpoint, in the coated cutting tool of the present embodiment, it is more preferable that the average thickness of the entire coating layer be 1.5 μm or more and 7.0 μm or less.

A method for producing the coating layer in the coated cutting tool of the present embodiment is not particularly limited, and examples thereof include physical vapor deposition methods such as an ion plating method, an arc ion plating method, a sputtering method, an ion mixing method, and the like. It is preferable to form the coating layer by using a physical vapor deposition method because a sharp edge can be formed. Among such methods, the arc ion plating method is more preferable because more excellent adhesion between the coating layer and the substrate is obtained.

A method for manufacturing the coated cutting tool of the present embodiment will be described using a specific example. The method for manufacturing the coated cutting tool of the present embodiment is not particularly limited as long as the configuration of the coated cutting tool can be achieved.

In the coated cutting tool of the present embodiment, the substrate consisting of a cubic boron nitride-containing sintered body is not particularly limited, and can be produced by a method including, for example, the following steps (A) to (H).

Step (A): 50% by volume to 90% by volume of cubic boron nitride and 10% by volume to 50% by volume of binder phase powder (the total of these is 100% by volume) are mixed. The binder phase powder preferably contains a metal element of at least one selected from the group consisting of Ti, Zr, Hf, V, Nb, Ta, Cr, Mo, W, Al, and Co. Alternatively, the binder phase powder contains a compound of a metal element of at least one selected from the group consisting of Ti, Zr, Hf, V, Nb, Ta, Cr, Mo, W, Al, and Co, and an element of at least one selected from the group consisting of carbon, nitrogen, oxygen, and boron.

Step (B): the raw material powder obtained in the step (A) is mixed by cemented carbide balls in a wet ball mill for 5 h to 24 h.

Step (C): the mixture obtained in the step (B) is molded into a predetermined shape to obtain a molded body.

Step (D): the molded body obtained in the step (C) is held for a predetermined time and sintered at a sintering temperature in the range of 1300° C. to 1500° C. under a pressure of 4.0 GPa to 7.0 GPa inside an ultrahigh pressure generator.

Step (E): the sintered body obtained in the step (D) is cut out according to the tool shape by an electric discharge machine.

Step (F): a substrate consisting of a cemented carbide is prepared.

Step (G): the sintered body cut out in the step (E) is joined to the substrate prepared in the step (F) by soldering or the like.

Step (H): the tool obtained in the step (G) is subjected to honing.

The coating layer used in the present embodiment can be manufactured by the following method, but this method is not particularly limiting.

The substrate machined into a tool shape is housed in a reaction vessel of a physical vapor deposition device, and a metal evaporation source is installed in the reaction vessel. Then, the inside of the reaction vessel is evacuated to a vacuum such that the pressure in the reaction vessel is $1.0 \times 10^{-2}$ Pa or less, and the substrate is heated with a heater located in the reaction vessel until the substrate temperature reaches 200° C. to 800° C. After heating, argon gas (Ar) is introduced into the reaction vessel to adjust the pressure in the reaction vessel to 0.5 Pa to 5.0 Pa. A bias voltage of −500 V to −200 V is applied to the substrate in an Ar atmosphere with a pressure of 0.5 Pa to 5.0 Pa, and a current of 40 A to 50 A is passed in a tungsten filament in the reaction vessel to subject the substrate surface to ion bombardment treatment with Ar. After subjecting the substrate surface to the ion bombardment treatment, the inside of the reaction vessel is evacuated to a vacuum such that the pressure in the reaction vessel is $1.0 \times 10^{-2}$ Pa or less.

Then, the temperature of the substrate is controlled so as to be 350° C. to 700° C., Ar, $N_2$ and acetylene gas ($C_2H_2$) are introduced into the reaction vessel, and the pressure in the reaction vessel is set to 2.0 Pa to 5.0 Pa. After that, a bias voltage of −150 V to −30 V is applied to the substrate, and the metal evaporation source corresponding to the metal component of each layer is evaporated by arc discharge of a current of 80 A to 200 A to start the formation of the Ti carbonitride layer on the substrate surface. Here, the flow rate of the acetylene gas ($C_2H_2$) introduced into the reaction vessel is gradually increased from the start of film formation to the end of film formation.

In order to set the atomic ratio x of the C element to the total of the C element and the N element of the composition represented by $Ti(C_xN_{1-x})$ to a predetermined value in the Ti carbonitride layer used in the present embodiment, for example, the ratio of Ar, $N_2$ and $C_2H_2$ introduced into the reaction vessel may be controlled in the above-described process of forming the Ti carbonitride layer. For example, the larger the ratio of $C_2H_2$ introduced into the reaction vessel, the larger the atomic ratio x of the C element tends to become. Further, the atomic ratio x of the C element can be gradually increased toward the surface opposite to the substrate in the composition of the carbonitride layer by gradually increasing the flow rate of the acetylene gas ($C_2H_2$) introduced into the reaction vessel from the start of film formation to the end of film formation in the above-described process of forming the Ti carbonitride layer. That is, the atomic ratio of the C element to a total of the C element and the N element at the position where the thickness is 75% from the substrate side can be made higher than the atomic ratio of the C element to a total of the C element and the N element at the position where the thickness is 25% from the substrate side in the Ti carbonitride layer. Further, as the amount of change in the flow rate of the acetylene gas ($C_2H_2$) introduced into the reaction vessel is larger, the difference in the atomic ratio x of the C element toward the surface on the opposite side of the substrate (the difference in the atomic ratio x of the C element between the position the position where the thickness is 75% and the position where the thickness is 25% from the substrate side) tends to increase.

In the Ti carbonitride layer used in the present embodiment, in order to set the absolute value of the difference between the maximum value and the minimum value of 2θ of the (111) plane and the (200) plane to a predetermined value, for example, the change amount of the flow rate of the acetylene gas ($C_2H_2$) introduced into the reaction vessel may be controlled in the above-described process of forming the Ti carbonitride layer. The smaller the amount of change in the flow rate of the acetylene gas ($C_2H_2$) introduced into the reaction vessel, the lower the anisotropic strain, and the smaller the absolute value of the difference between the maximum value and the minimum value of 2θ of the (111) plane and the (200) plane that can be obtained.

In the Ti carbonitride layer used in the present embodiment, in order to set the texture coefficient TC (111) of the (111) plane to a predetermined value, for example, the ratio of the mixed gas of acetylene gas ($C_2H_2$) and nitrogen gas ($N_2$) introduced into the reaction vessel in above-described process of forming the Ti carbonitride layer may be controlled. Further, the texture coefficient TC (111) of the (111) plane can be controlled to a predetermined value, for example, by adjusting the current value of arc discharge when evaporating the metal evaporation source corresponding to the metal component of each layer in the above-described process of forming the Ti carbonitride layer. Specifically, the smaller the current value of the arc discharge, the larger the texture coefficient TC (111) of the (111) plane tends to be.

In the coating layer used in the present embodiment, when a lower layer is formed between the substrate and the Ti carbonitride layer, the lower layer can be manufactured by, for example, the following method.

First, the substrate machined into a tool shape is housed in a reaction vessel of a physical vapor deposition device, and a metal evaporation source is installed in the reaction vessel. Then, the inside of the reaction vessel is evacuated to a vacuum of $1.0\times10^{-2}$ Pa or less, and the substrate is heated with a heater located in the reaction vessel until the substrate temperature reaches 200° C. to 800° C. After heating, argon gas (Ar) is introduced into the reaction vessel to adjust the pressure in the reaction vessel to 0.5 Pa to 5.0 Pa. A bias voltage of −500 V to −200 V is applied to the substrate in an Ar atmosphere with a pressure of 0.5 Pa to 5.0 Pa, and a current of 40 A to 50 A is passed in a tungsten filament in the reaction vessel to subject the substrate surface to ion bombardment treatment with Ar. After subjecting the substrate surface to the ion bombardment treatment, the inside of the reaction vessel is evacuated to a vacuum of $1.0\times10^{-2}$ Pa or less.

Then, the temperature of the substrate is controlled so as to be 350° C. to 700° C., nitrogen gas ($N_2$) and/or Ar is introduced into the reaction vessel, and the pressure in the reaction vessel is set to 2.0 Pa to 5.0 Pa. After that, a bias voltage of −120 V to −30 V is applied to the substrate, the metal evaporation source corresponding to the metal component of each layer is evaporated by arc discharge of a current of 80 A to 200 A, and the formation of the lower layer on the substrate surface is started.

In order to form an alternated layered structure of a first compound layer and a second compound layer as a lower layer, two or more kinds of metal evaporation sources are alternately evaporated by arc discharge under the above-mentioned conditions, so that the compound layers may be formed alternately. By adjusting the arc discharge time of the metal evaporation sources, it is possible to control the thickness of each compound layer forming the alternated layered structure.

After forming the lower layer, the temperature of the substrate is controlled to be 350° C. to 700° C., Ar, $N_2$ and acetylene gas ($C_2H_2$) are introduced into the reaction vessel, and the pressure in the reaction vessel is set to 2.0 Pa to 5.0 Pa. After that, a bias voltage of −150 V to −30 V is applied to the substrate, and the metal evaporation source corresponding to the metal component of each layer is evaporated by arc discharge with a current of 80 A to 200 A to start the formation of the Ti carbonitride layer on the surface of the lower layer. Here, the flow rate of the acetylene gas ($C_2H_2$) introduced into the reaction vessel is gradually increased from the start of film formation to the end of film formation.

The thickness of each layer constituting the coating layer used in the coated cutting tool of the present embodiment can be measured from a sectional structure of the coated cutting tool by using an optical microscope, a scanning electron microscope (SEM), a transmission electron microscope (TEM), or the like. The average thickness of each layer used in the coated cutting tool of the present embodiment can be determined by measuring the thickness of each layer from cross sections at three or more locations in the vicinity of the position at 50 μm from the edge ridge portion of the surface facing the metal evaporation source toward the center of the surface and calculating the average value (arithmetic average value) thereof, and more specifically, can be determined by the method described in Examples below.

Further, the composition of each layer constituting the coating layer used in the coated cutting tool of the present embodiment can be determined from the cross-sectional structure of the coated cutting tool of the present embodiment by using an energy dispersive X-ray analyzer (EDX), a wavelength dispersive X-ray analyzer (WDS), or the like. In the present embodiment, the composition of each layer constituting the coating layer is measured by the method described in Examples below.

It is considered that the coated cutting tool of the present embodiment exerts the effect of being able to extend the tool life as compared with the prior art due to excellent wear resistance and fracture resistance thereof (however, the factors that can extend the tool life are not limited thereto). The kind of the coated cutting tool of the present embodiment is not particularly limited, and specific examples thereof include a cutting edge exchangeable cutting insert for milling or turning, a drill, and an end mill.

EXAMPLES

Hereinafter, the present invention will be described in more detail with reference to examples, but the present invention is not limited to these examples.

Example 1

As a substrate, a substrate consisting of a cubic boron nitride-containing sintered body was prepared according to the following steps (1) to (8). At this time, the substrate was machined into the ISO standard CNGA120408 shape.

Step (1): 66% by volume of cubic boron nitride and 34% by volume of binder phase powder were mixed.

Step (2): a raw material powder obtained in the step (1) was mixed in a wet ball mill for 12 h by using cemented carbide balls.

Step (3): the mixture obtained in the step (2) was molded into a predetermined shape to obtain a molded body.

Step (4): the molded body obtained in the step (3) was sintered inside an ultrahigh-pressure generator at a pressure of 6.0 GPa at a sintering temperature of 1300° C. for 1 h.

Step (5): the sintered body obtained in the step (4) was cut out according to the tool shape with an electric discharge machine.

Step (6): a substrate made of a cemented carbide was prepared.

Step (7): the sintered body cut out in the step (5) was joined to the substrate prepared in the step (6) by soldering.

Step (8): the tool obtained in step (7) was subjected to honing.

In the prepared substrate, the composition of the binder phase contained in the cubic boron nitride-containing sintered body was identified by an X-ray diffractometer. The composition of the binder phase contained in the cubic boron nitride-containing sintered body was TiN, $Al_2O_3$, and AlN.

The metal evaporation source indicated in Table 1 was placed in the reaction vessel of an arc ion plating device. The prepared substrate was fixed to a fixing jig of a rotary table in the reaction vessel.

After that, the inside of the reaction vessel was evacuated to a vacuum such that the pressure in the reaction vessel was of $5.0\times10^{-3}$ Pa or less. After evacuation, the substrate was heated with a heater located in the reaction vessel until the substrate temperature reached 450° C. After heating, argon gas (Ar) was introduced into the reaction vessel to adjust the pressure in the reaction vessel to 2.7 Pa.

A bias voltage of −400 V was applied to the substrate in an Ar atmosphere with a pressure of 2.7 Pa, and a current of 40 A was passed in a tungsten filament in the reaction vessel to subject the substrate surface to ion bombardment treatment with Ar for 30 min. After the ion bombardment treatment, the inside of the reaction vessel was evacuated to a vacuum such that the pressure in the reaction vessel was $5.0\times10^{-3}$ Pa or less.

After evacuation, the temperature of the substrate was adjusted to the temperature shown in Table 1 (temperature at the start of film formation), Ar, nitrogen gas ($N_2$) and acetylene gas ($C_2H_2$) were introduced into the reaction vessel to obtain the flow rates shown in Table 1, and the pressure inside the reaction vessel was adjusted to that shown in Table 1.

Next, the bias voltage shown in Table 1 was applied to the substrate, and the metal evaporation source was evaporated by the arc discharge of the current shown in Table 1 so that the composition shown in Table 2 was obtained, thereby forming a coating layer on the substrate surface. The flow rate of acetylene gas ($C_2H_2$) introduced into the reaction vessel was gradually changed from the start of film formation to the end of film formation as shown in Table 1. As a coating layer, Ti carbonitride layer was formed in the invention products 1 to 10 and comparative products 1 to 7, a TiN layer was formed in the comparative product 8, and a TiAlN layer was formed in the comparative product 9.

Each layer was formed on the substrate surface to a predetermined average thickness shown in Table 2 to produce a coated cutting tool. After that, a power source of the heater was turned off, and after the temperature of the sample (coated cutting tool) became 100° C. or lower, the sample (coated cutting tool) was taken out from the reaction vessel. Thus, the coated cutting tools of the invention products 1 to 10 and the comparative products 1 to 9 were obtained.

The average thickness of the Ti carbonitride layer and the like of the obtained samples (coated cutting tools) was determined by observing, with a SEM, the cross sections at three locations in the vicinity of the position at 50 μm from the edge ridge portion of the surface of the coated cutting tool facing the metal evaporation source toward the center of the surface, measuring the thickness of each layer, and calculating the average value (arithmetic average value) thereof. The results are shown in Table 2. The composition of the Ti carbonitride layer or the like of the obtained sample (coated cutting tool) was measured at the measurement positions of cross sections at three locations in the vicinity of the position at 50 μm from the edge ridge portion of the surface of the coated cutting tool facing the metal evaporation source toward the center by using the energy dispersive X-ray analyzer (EDX) at positions at 25%, 50% and 75% from the substrate side with respect to the thickness of the Ti carbonitride layer or the like. The average value of the measurement results at three locations was taken as each composition. The results are also shown in Table 2. The atomic ratio of the C element in the Ti carbonitride layer in Table 2 is the atomic ratio of the C element to a total of the C element and the N element at a position where the thickness is 50% from the substrate side in the Ti carbonitride layer. Further, in the Ti carbonitride layer, the atomic ratio of the C element to a total of the C element and the N element at the positions where the thickness is 25% and 75% from the substrate side (also referred to as "R25" and "R75", respectively) was also measured. The results are shown in Table 3.

TABLE 1

| | | | | | $C_2H_2$ at the start time (sccm) | $N_2$ (sccm) | Ar (sccm) | Temperature (° C.) | Change amount of $C_2H_2$ gas (sccm/min) |
|---|---|---|---|---|---|---|---|---|---|
| | Metal evaporation source | Bias voltage (V) | Current (A) | Pressure (Pa) | | | | | |
| Invention Sample 1 | Ti | −100 | 150 | 2.8 | 5 | 260 | 1000 | 550 | 0.4 |
| Invention Sample 2 | Ti | −100 | 150 | 2.8 | 5 | 310 | 1000 | 550 | 0.2 |
| Invention Sample 3 | Ti | −100 | 150 | 2.8 | 28 | 310 | 1000 | 550 | 0.3 |
| Invention Sample 4 | Ti | −80 | 150 | 2.8 | 5 | 260 | 1000 | 550 | 0.3 |
| Invention Sample 5 | Ti | −100 | 150 | 2.8 | 20 | 310 | 1000 | 550 | 0.2 |

TABLE 1-continued

| | Production conditions | | | | | | | |
|---|---|---|---|---|---|---|---|---|
| | Metal evaporation source | Bias voltage (V) | Current (A) | Pressure (Pa) | $C_2H_2$ at the start time (sccm) | $N_2$ (sccm) | Ar (sccm) | Temperature (° C.) | Change amount of $C_2H_2$ gas (sccm/min) |
| Invention Sample 6 | Ti | −100 | 150 | 2.8 | 5 | 310 | 1000 | 550 | 0.6 |
| Invention Sample 7 | Ti | −100 | 150 | 2.8 | 5 | 310 | 1000 | 550 | 0.8 |
| Invention Sample 8 | Ti | −120 | 150 | 2.8 | 5 | 310 | 690 | 550 | 0.2 |
| Invention Sample 9 | Ti | −100 | 120 | 2.8 | 20 | 310 | 1000 | 550 | 0.1 |
| Invention Sample 10 | Ti | −100 | 150 | 2.8 | 28 | 310 | 1000 | 550 | 0.5 |
| Comparative Sample 1 | Ti | −100 | 150 | 2.8 | 28 | 260 | 690 | 550 | Constant |
| Comparative Sample 2 | Ti | −100 | 150 | 2.8 | 50 | 260 | 690 | 550 | −0.3 |
| Comparative Sample 3 | Ti | −100 | 200 | 2.8 | 5 | 305 | 690 | 550 | 0.3 |
| Comparative Sample 4 | Ti | −100 | 80 | 2.8 | 5 | 210 | 690 | 550 | 0.3 |
| Comparative Sample 5 | Ti | −100 | 150 | 2.8 | 3 | 310 | 1000 | 550 | 1.0 |
| Comparative Sample 6 | Ti | −100 | 150 | 2.8 | 5 | 260 | 690 | 550 | 1.5 |
| Comparative Sample 7 | Ti | −100 | 150 | 2.8 | 5 | 260 | 690 | 550 | 0.1 |
| Comparative Sample 8 | Ti | −100 | 150 | 2.8 | 0 | 310 | 0 | 550 | — |
| Comparative Sample 9 | TiAl | −100 | 150 | 2.8 | 0 | 310 | 0 | 550 | — |

* "—" in Table 1 indicates that $C_2H_2$ gas is not used. Further, "Change amount of $C_2H_2$ gas" indicates the amount by which the $C_2H_2$ amount was changed in 1 min, a positive value indicates that the $C_2H_2$ amount was increased, and a negative value indicates that the $C_2H_2$ amount was decreased. "Constant" indicates that the $C_2H_2$ amount was not changed.

TABLE 2

| | Coating layer | | |
|---|---|---|---|
| | Ti carbonitride layer $Ti(C_xN_{1-x})N$ | | Total thickness (μm) |
| | Atomic ratio of C element, x | Average thickness (μm) | |
| Invention Sample 1 | 0.33 | 2.5 | 2.5 |
| Invention Sample 2 | 0.21 | 2.5 | 2.5 |
| Invention Sample 3 | 0.44 | 2.5 | 2.5 |
| Invention Sample 4 | 0.31 | 2.5 | 2.5 |
| Invention Sample 5 | 0.31 | 2.5 | 2.5 |
| Invention Sample 6 | 0.31 | 2.5 | 2.5 |
| Invention Sample 7 | 0.30 | 1.0 | 1.0 |
| Invention Sample 8 | 0.30 | 4.7 | 4.7 |
| Invention Sample 9 | 0.30 | 2.5 | 2.5 |
| Invention Sample 10 | 0.44 | 1.5 | 1.5 |
| Comparative Sample 1 | 0.32 | 2.5 | 2.5 |
| Comparative Sample 2 | 0.30 | 2.5 | 2.5 |
| Comparative Sample 3 | 0.27 | 2.5 | 2.5 |
| Comparative Sample 4 | 0.28 | 2.5 | 2.5 |
| Comparative Sample 5 | 0.32 | 2.5 | 2.5 |
| Comparative Sample 6 | 0.30 | 0.5 | 0.5 |
| Comparative Sample 7 | 0.30 | 10.0 | 10.0 |
| Comparative Sample 8 | 0.00 | 2.5 | 2.5 |
| Comparative Sample 9 | 0.00 | 2.5 | 2.5 |

* As the coating layer, a TiN layer was formed in the Comparative Sample 8 and a TiAlN layer was formed in the Comparative Sample 9. In Table 2, the average thickness of the coating layer in the Comparative Sample 8 represents the average thickness of the TiN layer, and the average thickness of the coating layer in the Comparative Sample 9 represents the average thickness of the TiAlN layer.

TABLE 3

| | Atomic ratio of C element in Ti carbonitride layer | | | |
|---|---|---|---|---|
| | Position at 25% (R25) | Position at 75% (R75) | Difference in atomic ratio of C element (R75 − R25) | Relation between atomic ratios of C element |
| Invention Sample 1 | 0.13 | 0.44 | 0.31 | R25 < R75 |
| Invention Sample 2 | 0.12 | 0.35 | 0.23 | R25 < R75 |
| Invention Sample 3 | 0.31 | 0.48 | 0.17 | R25 < R75 |
| Invention Sample 4 | 0.14 | 0.42 | 0.28 | R25 < R75 |
| Invention Sample 5 | 0.20 | 0.41 | 0.21 | R25 < R75 |
| Invention Sample 6 | 0.13 | 0.44 | 0.31 | R25 < R75 |
| Invention Sample 7 | 0.15 | 0.42 | 0.27 | R25 < R75 |
| Invention Sample 8 | 0.16 | 0.41 | 0.25 | R25 < R75 |
| Invention Sample 9 | 0.26 | 0.35 | 0.09 | R25 < R75 |
| Invention Sample 10 | 0.31 | 0.48 | 0.17 | R25 < R75 |
| Comparative Sample 1 | 0.32 | 0.32 | 0.00 | R25 = R75 |
| Comparative Sample 2 | 0.42 | 0.13 | −0.29 | R75 < R25 |
| Comparative Sample 3 | 0.15 | 0.40 | 0.25 | R25 < R75 |
| Comparative Sample 4 | 0.14 | 0.41 | 0.27 | R25 < R75 |
| Comparative Sample 5 | 0.06 | 0.48 | 0.42 | R25 < R75 |
| Comparative Sample 6 | 0.13 | 0.43 | 0.30 | R25 < R75 |
| Comparative Sample 7 | 0.17 | 0.43 | 0.26 | R25 < R75 |
| Comparative Sample 8 | 0.00 | 0.00 | 0.00 | — |
| Comparative Sample 9 | 0.00 | 0.00 | 0.00 | — |

* "—" in the table means that the C element is not contained.

Absolute Value of Difference between Maximum Value and Minimum Value of 2θ

The absolute value of the difference between the maximum value and the minimum value of 2θ in the X-ray diffraction measurement of the Ti carbonitride layer was measured as follows for the obtained samples (coated cutting tools). As the measuring device, an X-ray diffraction analyzer equipped with a two-dimensional detector was used. The X-ray tube was Cu-Kα, and the measurement was 2θ-ψ measurement. Frame measurement was performed at 10° intervals in the range of ψ angle of 0° to 70° with respect to the peak position of the (111) plane of the Ti carbonitride layer. In the measurement per one frame, the measurement time was adjusted so that the intensity count from the crystal plane ((111) plane or (200) plane) was 2 times to 3 times the background. Since the intensity varies depending on the layer thickness and the like, the time was adjusted for each sample. The analysis specified the peak position 2θ of the (111) plane by using software provided with the X-ray diffraction analyzer. The absolute value of the difference between the maximum value and the minimum value of 2θ represented by the following formula (2) was calculated when the measurement was performed at each of ψ angles of 0°, 30°, 50° and 70°.

Absolute value of the difference between the maximum value and the minimum value of 2θ=|2θ max−2θ min| (2)

in the formula (2), 2θ max represents a maximum value among peak positions 2θ of the (111) when the ψ angle is 0°, 30°, 50°, and 70°, and 2θ min represents a minimum value among peak positions 2θ of the (111) plane when the ψ angle is 0°, 30°, 50°, and 70°.

The absolute value of the difference between the maximum value and the minimum value of the peak position 2θ of the (200) plane of the Ti carbonitride layer was measured in the same manner. The measurement results are shown in Table 4.

Texture Coefficient TC (111)

For the obtained samples (coated cutting tools), X-ray diffraction measurement with a 2θ/θ concentrated optical system using a Cu-Kα ray was performed under the conditions of the output: 50 kV, 250 mA, incident side solar slit: 5°, divergence vertical slit: 2/3°, divergence vertical restriction slit: 5 mm, scattering slit: 2/3°, light receiving side solar slit: 5°, light receiving slit: 0.3 mm, BENT monochromator, light receiving monochromatic slit: 0.8 mm, sampling width: 0.01°, scan speed: 4°/min, and 2θ measurement range: 25° to 140°. As the apparatus, an X-ray diffractometer manufactured by Rigaku Corporation (model "RINT TTR III") was used. The peak intensity of each crystal plane of the Ti carbonitride layer or the like was obtained from the X-ray diffraction pattern. From the obtained peak intensity of each crystal plane, the texture coefficient TC (111) of the (111) plane in the Ti carbonitride layer or the like was calculated from the formula (1) below. The results are shown in Table 4.

$$TC(111) = \frac{I(111)}{I_0(111)}\left\{\frac{1}{6}\Sigma\frac{I(hkl)}{I_0(hkl)}\right\}^{-1} \quad (1)$$

in the formula (1), I(hkl) represents a peak intensity of an (hkl) plane in X-ray diffraction of the Ti carbonitride layer, $I_0$(hkl) represents a standard diffraction intensity of the (hkl) plane in an ICDD card number 00-042-1488, and (hkl) indicates six crystal planes of (111), (200), (220), (311), (420), (422).

TABLE 4

| | Texture coefficient | Absolute value (°) of difference between maximum value and minimum value of 2θ | |
|---|---|---|---|
| | TC (111) | (111) plane | (200) plane |
| Invention Sample 1 | 1.6 | 0.03 | 0.04 |
| Invention Sample 2 | 1.5 | 0.02 | 0.04 |
| Invention Sample 3 | 1.7 | 0.05 | 0.05 |
| Invention Sample 4 | 1.2 | 0.04 | 0.03 |
| Invention Sample 5 | 1.9 | 0.03 | 0.03 |
| Invention Sample 6 | 1.5 | 0.08 | 0.09 |
| Invention Sample 7 | 1.6 | 0.07 | 0.07 |
| Invention Sample 8 | 1.4 | 0.06 | 0.07 |
| Invention Sample 9 | 1.5 | 0.03 | 0.03 |
| Invention Sample 10 | 1.7 | 0.05 | 0.05 |
| Comparative Sample 1 | 1.6 | 0.01 | 0.01 |
| Comparative Sample 2 | 1.5 | 0.09 | 0.08 |
| Comparative Sample 3 | 0.5 | 0.04 | 0.04 |
| Comparative Sample 4 | 2.4 | 0.04 | 0.05 |
| Comparative Sample 5 | 1.4 | 0.12 | 0.13 |
| Comparative Sample 6 | 1.6 | 0.14 | 0.15 |
| Comparative Sample 7 | 1.6 | 0.07 | 0.07 |
| Comparative Sample 8 | 1.6 | 0.00 | 0.00 |
| Comparative Sample 9 | 1.5 | 0.00 | 0.00 |

The following cutting test was performed using the obtained samples (coated cutting tools). The results are shown in Table 5.

Cutting Test
Insert shape: CNGA120408
Work material: SCM420H (60HRC)
Work material shape: cylinder φ60 mm×200 mm
Cutting speed: 130 m/min
Feed: 0.15 mm/rev
Depth of cut: 0.15 mm
Coolant: used
Evaluation item: when a corner wear (VBc) reached 0.15 mm, it was defined as the tool life, and the machining time until the tool life was measured.

TABLE 5

| | Cutting test Machining time (min) |
|---|---|
| Invention Sample 1 | 166 |
| Invention Sample 2 | 154 |
| Invention Sample 3 | 170 |
| Invention Sample 4 | 160 |
| Invention Sample 5 | 176 |
| Invention Sample 6 | 147 |
| Invention Sample 7 | 141 |
| Invention Sample 8 | 178 |
| Invention Sample 9 | 144 |
| Invention Sample 10 | 150 |
| Comparative Sample 1 | 122 |
| Comparative Sample 2 | 112 |
| Comparative Sample 3 | 131 |
| Comparative Sample 4 | 135 |
| Comparative Sample 5 | 92 |
| Comparative Sample 6 | 125 |
| Comparative Sample 7 | 76 |
| Comparative Sample 8 | 84 |
| Comparative Sample 9 | 102 |

In the cutting test, the machining time until the tool life of the invention products was 141 minutes or longer, which was longer than the machining time of all the comparative products. The long machining time was due to the fact that the progress of wear was slow and the fractures were unlikely to occur, and the cutting tools could be evaluated as being excellent in the wear resistance and the fracture resistance.

The above results reveal that the tool life of the invention products is extended by improving the wear resistance and the fracture resistance.

Example 2

As a substrate, a substrate consisting of a cubic boron nitride-containing sintered body was prepared by the same method as in Example 1. At this time, the substrate was machined into the ISO standard CNGA120408 shape.

In the prepared substrate, the composition of the binder phase contained in the cubic boron nitride-containing sintered body was identified by an X-ray diffractometer. The composition of the binder phase contained in the cubic boron nitride-containing sintered body was TiN, $Al_2O_3$, and AlN.

Metal evaporation sources such as to obtain the composition of each layer shown in Table 9 were placed in the reaction vessel of an arc ion plating device. The prepared substrate was fixed to a fixing jig of a rotary table in the reaction vessel.

After that, the inside of the reaction vessel was evacuated to a vacuum such that the pressure in the reaction vessel was of $5.0 \times 10^{-3}$ Pa or less. After evacuation, the substrate was heated with a heater located in the reaction vessel until the substrate temperature reached 450° C. After heating, argon gas (Ar) was introduced into the reaction vessel to adjust the pressure in the reaction vessel to 2.7 Pa.

A bias voltage of −400 V was applied to the substrate in an Ar atmosphere with a pressure of 2.7 Pa, and a current of 40 A was passed in a tungsten filament in the reaction vessel to subject the substrate surface to ion bombardment treatment with Ar for 30 min. After the ion bombardment treatment, the inside of the reaction vessel was evacuated to a vacuum such that the pressure in the reaction vessel was $5.0 \times 10^{-3}$ Pa or less.

After evacuation, the temperature of the substrate was adjusted to 550° C., $N_2$ was introduced into the reaction vessel to obtain the flow rate shown in Table 6, and the pressure inside the reaction vessel was adjusted to that shown in Table 6.

Next, the bias voltage shown in Table 6 was applied to the substrate, and the metal evaporation source was evaporated by the arc discharge of the current shown in Table 6 so that the composition shown in Table 9 was obtained, thereby forming the first layer (compound layer) of the coating layer on the substrate surface.

In the invention products 11, 13 and 14, the second layer (metal layer) of the lower layer was formed as follows. First, after forming the first layer (compound layer) of the lower layer, the substrate was adjusted to 550° C., Ar was introduced into the reaction vessel to obtain the flow rates shown in Table 7, and the inside of the reaction vessel was adjusted to the pressure shown in Table 7.

Then, the bias voltage shown in Table 7 was applied to the substrate, and the metal evaporation source was evaporated by the arc discharge of the current shown in Table 7 to obtain the composition shown in Table 9, thereby forming the second layer (metal layer) of the lower layer on the surface of the first layer (compound layer) of the lower layer.

TABLE 6

| | First layer of lower layer | | | |
|---|---|---|---|---|
| | Bias voltage (V) | Current (A) | Pressure (Pa) | $N_2$ (sccm) |
| Invention Sample 11 | −40 | 150 | 3.3 | 1000 |
| Invention Sample 12 | −40 | 150 | 3.3 | 1000 |
| Invention Sample 13 | −40 | 150 | 3.3 | 1000 |
| Invention Sample 14 | −40 | 150 | 3.3 | 1000 |
| Invention Sample 15 | −40 | 150 | 3.3 | 1000 |
| Invention Sample 16 | −40 | 150 | 3.3 | 1000 |
| Invention Sample 17 | −40 | 150 | 3.3 | 1000 |
| Invention Sample 18 | −40 | 150 | 3.3 | 1000 |
| Invention Sample 19 | −40 | 150 | 3.3 | 1000 |

TABLE 7

| | Second layer of lower layer | | | | |
|---|---|---|---|---|---|
| | Bias voltage (V) | Current (A) | Pressure (Pa) | $N_2$ (sccm) | Ar (sccm) |
| Invention Sample 11 | −40 | 150 | 2.8 | 0 | 1000 |
| Invention Sample 12 | Second layer is not formed | | | | |
| Invention Sample 13 | −40 | 150 | 2.8 | 0 | 1000 |
| Invention Sample 14 | −40 | 200 | 2.8 | 0 | 1000 |
| Invention Sample 15 | Second layer is not formed | | | | |
| Invention Sample 16 | Second layer is not formed | | | | |
| Invention Sample 17 | Second layer is not formed | | | | |
| Invention Sample 18 | Second layer is not formed | | | | |
| Invention Sample 19 | Second layer is not formed | | | | |

After forming the lower layer, the temperature of the substrate was adjusted to the temperature shown in Table 8 (temperature at the start of film formation), Ar, nitrogen gas ($N_2$) and acetylene gas ($C_2H_2$) were introduced into the reaction vessel to obtain the flow rates shown in Table 8, and the pressure inside the reaction vessel was adjusted to that shown in in Table 8.

Next, the bias voltage shown in Table 8 was applied to the substrate, and the metal evaporation source was evaporated by the arc discharge of the current shown in Table 8 so that the composition shown in Table 9 was obtained, thereby forming a Ti carbonitride layer on the surface of the lower layer. The flow rate of acetylene gas ($C_2H_2$) introduced into the reaction vessel was gradually changed from the start of film formation to the end of film formation as shown in Table 8.

Each layer was formed on the substrate surface to a predetermined average thickness shown in Table 9 to produce a coated cutting tool. After that, the power source of the heater was turned off, and after the temperature of the sample (coated cutting tool) became 100° C. or lower, the sample (coated cutting tool) was taken out from the reaction vessel. Thus, the coated cutting tools of the invention products 11 to 19 were obtained.

The average thickness and composition of the Ti carbonitride layer and the like of the obtained samples (coated cutting tools) were measured by the same method as in Example 1. The results are shown in Table 9. The atomic ratio of the C element in the Ti carbonitride layer to a total of the C element and the N element at positions where the thickness was 25% and 75% from the substrate side in the Ti carbonitride layer of the obtained samples (coated cutting tools) was also measured in the same manner as Example 1. The results are shown in Table 10.

TABLE 8

| | Production conditions | | | | | | | | |
|---|---|---|---|---|---|---|---|---|---|
| | Metal evaporation source | Bias voltage (V) | Current (A) | Pressure (Pa) | $C_2H_2$ at the start time (sccm) | $N_2$ (sccm) | Ar (sccm) | Temperature (°C.) | Change amount of $C_2H_2$ gas (sccm/min) |
| Invention Sample 11 | Ti | −100 | 150 | 2.8 | 5 | 260 | 1000 | 550 | 0.4 |
| Invention Sample 12 | Ti | −100 | 150 | 2.8 | 5 | 260 | 1000 | 550 | 0.4 |
| Invention Sample 13 | Ti | −100 | 150 | 2.8 | 5 | 260 | 1000 | 550 | 0.4 |
| Invention Sample 14 | Ti | −100 | 150 | 2.8 | 5 | 260 | 1000 | 550 | 0.4 |
| Invention Sample 15 | Ti | −100 | 150 | 2.8 | 5 | 260 | 1000 | 550 | 0.4 |
| Invention Sample 16 | Ti | −100 | 150 | 2.8 | 5 | 260 | 1000 | 550 | 0.4 |
| Invention Sample 17 | Ti | −100 | 150 | 2.8 | 5 | 260 | 1000 | 550 | 0.4 |
| Invention Sample 18 | Ti | −120 | 150 | 2.8 | 5 | 310 | 690 | 550 | 0.2 |
| Invention Sample 19 | Ti | −100 | 150 | 2.8 | 5 | 260 | 1000 | 550 | 0.4 |

TABLE 9

| | Coating layer | | | | | | |
|---|---|---|---|---|---|---|---|
| | Lower layer | | | | Ti carbonitride layer $Ti(C_xN_{1-x})N$ | | |
| | First layer | | Second layer | | | | |
| | Composition | Average thickness (μm) | Composition | Average thickness (μm) | Atomic ratio of C element, x | Average thickness (μm) | Total thickness (μm) |
| Invention Sample 11 | $(Ti_{0.33}Al_{0.67})N$ | 1.0 | Ti | 0.1 | 0.33 | 2.5 | 3.6 |
| Invention Sample 12 | $(Al_{0.70}Cr_{0.30})N$ | 1.0 | — | — | 0.33 | 2.5 | 3.5 |
| Invention Sample 13 | $(Ti_{0.70}Al_{0.20}Si_{0.10})N$ | 1.0 | Ti | 0.1 | 0.33 | 2.5 | 3.6 |
| Invention Sample 14 | $(Ti_{0.70}Al_{0.25}W_{0.05})N$ | 1.0 | W | 0.1 | 0.33 | 2.5 | 3.6 |
| Invention Sample 15 | $(Ti_{0.85}Mo_{0.15})N$ | 1.0 | — | — | 0.33 | 2.5 | 3.5 |
| Invention Sample 16 | $(Ti_{0.33}Al_{0.67})N$ | 0.5 | — | — | 0.33 | 2.5 | 3.0 |
| Invention Sample 17 | $(Ti_{0.33}Al_{0.67})N$ | 4.5 | — | — | 0.33 | 2.5 | 7.0 |
| Invention Sample 18 | $(Ti_{0.33}Al_{0.67})N$ | 1.0 | — | — | 0.30 | 4.7 | 5.7 |
| Invention Sample 19 | $(Ti_{0.33}Al_{0.67})N$ | 1.0 | — | — | 0.33 | 2.5 | 3.5 |

* "—" indicates that the layer was not formed

TABLE 10

| | Atomic ratio of C element in Ti carbonitride layer | | | |
|---|---|---|---|---|
| | Position at 25% (R25) | Position at 75% (R75) | Difference in atomic ratio of C element (R75 − R25) | Relation between atomic ratios of C element |
| Invention Sample 11 | 0.13 | 0.44 | 0.31 | R25 < R75 |
| Invention Sample 12 | 0.13 | 0.44 | 0.31 | R25 < R75 |
| Invention Sample 13 | 0.13 | 0.44 | 0.31 | R25 < R75 |
| Invention Sample 14 | 0.13 | 0.44 | 0.31 | R25 < R75 |
| Invention Sample 15 | 0.13 | 0.44 | 0.31 | R25 < R75 |
| Invention Sample 16 | 0.13 | 0.44 | 0.31 | R25 < R75 |
| Invention Sample 17 | 0.13 | 0.44 | 0.31 | R25 < R75 |
| Invention Sample 18 | 0.16 | 0.41 | 0.25 | R25 < R75 |
| Invention Sample 19 | 0.13 | 0.44 | 0.31 | R25 < R75 |

Absolute Value of Difference between Maximum Value and Minimum Value of 2θ

The absolute value of the difference between the maximum value and the minimum value of 2θ in the X-ray diffraction measurement of the Ti carbonitride layer was measured for the obtained samples (coated cutting tools) by the same method as in Example 1. The measurement results are shown in Table 11.

Texture Coefficient TC (111)

The texture coefficient TC (111) of the (111) plane in the Ti carbonitride layer or the like was calculated for the obtained samples (coated cutting tools) by the same method as in Example 1. The measurement results are shown in Table 11.

TABLE 11

| | Texture coefficient | Absolute value (°) of difference between maximum value and minimum value of 2θ | |
|---|---|---|---|
| | TC (111) | (111) plane | (200) plane |
| Invention Sample 11 | 1.6 | 0.03 | 0.04 |
| Invention Sample 12 | 1.6 | 0.03 | 0.04 |
| Invention Sample 13 | 1.6 | 0.03 | 0.04 |
| Invention Sample 14 | 1.6 | 0.03 | 0.04 |
| Invention Sample 15 | 1.6 | 0.03 | 0.04 |
| Invention Sample 16 | 1.6 | 0.03 | 0.04 |
| Invention Sample 17 | 1.6 | 0.03 | 0.04 |
| Invention Sample 18 | 1.4 | 0.06 | 0.07 |
| Invention Sample 19 | 1.6 | 0.03 | 0.04 |

The following cutting test was performed using the obtained samples (coated cutting tools). The results are shown in Table 12.

Cutting Test

Insert shape: CNGA120408

Work material: SCM420H (60HRC)

Work material shape: cylinder φ150 mm×300 mm

Cutting speed: 130 m/min

Feed: 0.15 mm/rev

Depth of cut: 0.15 mm

Coolant: used

Evaluation item: when a corner wear (VBc) reached 0.15 mm, it was defined as the tool life, and the machining time until the tool life was measured.

TABLE 12

| | Cutting test Machining time (min) |
|---|---|
| Invention Sample 11 | 189 |
| Invention Sample 12 | 175 |
| Invention Sample 13 | 182 |
| Invention Sample 14 | 177 |
| Invention Sample 15 | 186 |

TABLE 12-continued

| | Cutting test Machining time (min) |
|---|---|
| Invention Sample 16 | 173 |
| Invention Sample 17 | 198 |
| Invention Sample 18 | 202 |
| Invention Sample 19 | 180 |

In the cutting test, the machining time until the tool life of the invention products 11 to 19 was 173 minutes or longer.

The above results reveal that the tool life of the invention products is extended by improving the wear resistance and the fracture resistance.

Example 3

As a substrate, a substrate consisting of a cubic boron nitride-containing sintered body was prepared by the same method as in Example 1. At this time, the substrate was machined into the ISO standard CNGA120408 shape.

In the prepared substrate, the composition of the binder phase contained in the cubic boron nitride-containing sintered body was identified by an X-ray diffractometer. The composition of the binder phase contained in the cubic boron nitride-containing sintered body was TiN, $Al_2O_3$, and AlN.

Metal evaporation sources such as to obtain the composition of each layer shown in Table 15 were placed in the reaction vessel of an arc ion plating device. The prepared substrate was fixed to a fixing jig of a rotary table in the reaction vessel.

After that, the inside of the reaction vessel was evacuated to a vacuum such that the pressure in the reaction vessel was of $5.0\times10^{-3}$ Pa or less. After evacuation, the substrate was heated with a heater located in the reaction vessel until the substrate temperature reached 450° C. After heating, argon gas (Ar) was introduced into the reaction vessel to adjust the pressure in the reaction vessel to 2.7 Pa.

A bias voltage of −400 V was applied to the substrate in an Ar atmosphere with a pressure of 2.7 Pa, and a current of 40 A was passed in a tungsten filament in the reaction vessel to subject the substrate surface to ion bombardment treatment with Ar for 30 min. After the ion bombardment treatment, the inside of the reaction vessel was evacuated to a vacuum such that the pressure in the reaction vessel was $5.0\times10^{-3}$ Pa or less.

After evacuation, the temperature of the substrate was adjusted to 550° C., $N_2$ was introduced into the reaction vessel to obtain the flow rate shown in Table 13, and the pressure inside the reaction vessel was adjusted to that shown in Table 13. Thereafter, the bias voltage shown in Table 13 was applied to the substrate, and the metal evaporation sources of the first compound layer and the second compound layer of the lower layer having the compositions shown in Table 15 were alternately evaporated in this order by the arc discharge of the arc current shown in Table 13, thereby alternately forming the first compound layer and the second compound layer of the lower layer in this order on the substrate surface. At that time, the pressure inside the reaction vessel was controlled to the value shown in Table 13. Further, the thickness of the first compound layer and the second compound layer of the lower layer was controlled by adjusting each arc discharge time to obtain the thicknesses shown in Table 15.

TABLE 13

| | First compound layer | | | | Second compound layer | | | |
|---|---|---|---|---|---|---|---|---|
| | Bias voltage (V) | Current (A) | Pressure (Pa) | $N_2$ (sccm) | Bias voltage (V) | Current (A) | Pressure (Pa) | $N_2$ (sccm) |
| Invention Sample 20 | −40 | 150 | 3.3 | 1000 | −40 | 150 | 3.3 | 1000 |
| Invention Sample 21 | −40 | 150 | 3.3 | 1000 | −40 | 150 | 3.3 | 1000 |
| Invention Sample 22 | −40 | 150 | 3.3 | 1000 | −40 | 150 | 3.3 | 1000 |
| Invention Sample 23 | −40 | 150 | 3.3 | 1000 | −40 | 150 | 3.3 | 1000 |
| Invention Sample 24 | −40 | 150 | 3.3 | 1000 | −40 | 150 | 3.3 | 1000 |
| Invention Sample 25 | −40 | 150 | 3.3 | 1000 | −40 | 150 | 3.3 | 1000 |

After forming the lower layer, the temperature of the substrate was adjusted to the temperature shown in Table 14 (temperature at the start of film formation), Ar, nitrogen gas ($N_2$) and acetylene gas ($C_2H_2$) were introduced into the reaction vessel to obtain the flow rates shown in Table 14, and the pressure inside the reaction vessel was adjusted to that shown in Table 14.

Next, the bias voltage shown in Table 14 was applied to the substrate, and the metal evaporation source was evaporated by the arc discharge of the current shown in Table 14 so that the composition shown in Table 15 was obtained, thereby forming a Ti carbonitride layer on the surface of the lower layer. The flow rate of acetylene gas ($C_2H_2$) introduced into the reaction vessel was gradually changed from the start of film formation to the end of film formation as shown in Table 14.

Each layer was formed on the substrate surface to a predetermined average thickness shown in Table 15 to produce a coated cutting tool. After that, a power source of the heater was turned off, and after the temperature of the sample (coated cutting tool) became 100° C. or lower, the sample (coated cutting tool) was taken out from the reaction vessel. Thus, the coated cutting tools of the invention products 20 to 25.

The average thickness and composition of the Ti carbonitride layer and the like of the obtained samples (coated cutting tools) were measured in the same manner as in Example 1. The results are shown in Table 15. Further, in the Ti carbonitride layer of the obtained samples (coated cutting tools), the atomic ratio of the C element to a total of the C element and the N element at the positions where the thickness was 25% and 75% from the substrate side was also measured by the same method as in Example 1. The results are shown in Table 16.

TABLE 14

| | Production conditions | | | | | | | | |
|---|---|---|---|---|---|---|---|---|---|
| | Metal evaporation source | Bias voltage (V) | Current (A) | Pressure (Pa) | $C_2H_2$ at the start time (sccm) | $N_2$ (sccm) | Ar (sccm) | Temperature (° C.) | Change amount of $C_2H_2$ gas (sccm/min) |
| Invention Sample 20 | Ti | −100 | 150 | 2.8 | 5 | 260 | 1000 | 550 | 0.4 |
| Invention Sample 21 | Ti | −100 | 150 | 2.8 | 5 | 260 | 1000 | 550 | 0.4 |
| Invention Sample 22 | Ti | −100 | 150 | 2.8 | 5 | 260 | 1000 | 550 | 0.4 |
| Invention Sample 23 | Ti | −100 | 150 | 2.8 | 5 | 260 | 1000 | 550 | 0.4 |
| Invention Sample 24 | Ti | −120 | 150 | 2.8 | 5 | 310 | 690 | 550 | 0.2 |
| Invention Sample 25 | Ti | −100 | 150 | 2.8 | 5 | 260 | 1000 | 550 | 0.4 |

TABLE 15

| | Coating layer | | | | | | | |
|---|---|---|---|---|---|---|---|---|
| | Lower layer | | | | | | Ti carbonitride layer $Ti(C_xN_{1-x})N$ | |
| | Alternating laminate structure | | | | | | | |
| | First compound layer | | Second compound layer | | | | | |
| | Composition | Average thickness per one layer (nm) | Composition | Average thickness per one layer (nm) | Number of repetitions | Total thickness of lower layer (μm) | Atomic ratio of C element, x | Average thickness (μm) | Total thickness of coating layer (μm) |
| Invention Sample 20 | $(Ti_{0.33}Al_{0.67})N$ | 5 | $(Ti_{0.67}Al_{0.33})N$ | 5 | 100 | 1.0 | 0.33 | 2.5 | 3.5 |
| Invention Sample 21 | $(Al_{0.70}Cr_{0.30})N$ | 100 | $(Ti_{0.80}Si_{0.20})N$ | 100 | 10 | 2.0 | 0.33 | 2.5 | 4.5 |
| Invention Sample 22 | $(Ti_{0.70}Al_{0.20}Si_{0.10})N$ | 20 | $(Ti_{0.70}Al_{0.25}W_{0.05})N$ | 20 | 50 | 2.0 | 0.33 | 2.5 | 4.5 |
| Invention Sample 23 | $(Ti_{0.33}Al_{0.67})N$ | 300 | $(Ti_{0.50}Al_{0.50})N$ | 300 | 4 | 2.4 | 0.33 | 2.5 | 4.9 |
| Invention Sample 24 | $(Ti_{0.85}Mo_{0.15})N$ | 20 | $(Ti_{0.50}Al_{0.50})N$ | 20 | 50 | 2.0 | 0.30 | 4.7 | 6.7 |
| Invention Sample 25 | $(Ti_{0.33}Al_{0.67})N$ | 100 | $(Ti_{0.50}Al_{0.50})N$ | 100 | 20 | 4.0 | 0.33 | 2.5 | 6.5 |

TABLE 16

| | Atomic ratio of C element in Ti carbonitride layer | | | |
|---|---|---|---|---|
| | Position at 25% (R25) | Position at 75% (R75) | Difference in atomic ratio of C element (R75 − R25) | Relation between atomic ratios of C element |
| Invention Sample 20 | 0.13 | 0.44 | 0.31 | R25 < R75 |
| Invention Sample 21 | 0.13 | 0.44 | 0.31 | R25 < R75 |
| Invention Sample 22 | 0.13 | 0.44 | 0.31 | R25 < R75 |
| Invention Sample 23 | 0.13 | 0.44 | 0.31 | R25 < R75 |
| Invention Sample 24 | 0.16 | 0.41 | 0.25 | R25 < R75 |
| Invention Sample 25 | 0.13 | 0.44 | 0.31 | R25 < R75 |

Absolute Value of Difference between Maximum Value and Minimum Value of 2θ

The absolute value of the difference between the maximum value and the minimum value of 2θ in the X-ray diffraction measurement of the Ti carbonitride layer was measured for the obtained samples (coated cutting tools) by the same method as in Example 1. The measurement results are shown in Table 17.

Texture Coefficient TC (111)

The texture coefficient TC (111) of the (111) plane in the Ti carbonitride layer or the like was calculated for the obtained samples (coated cutting tools) by the same method as in Example 1. The measurement results are shown in Table 17.

TABLE 17

| | Texture coefficient | Absolute value (°) of difference between maximum value and minimum value of 2θ | |
|---|---|---|---|
| | TC (111) | (111) plane | (200) plane |
| Invention Sample 20 | 1.6 | 0.03 | 0.04 |
| Invention Sample 21 | 1.6 | 0.03 | 0.04 |
| Invention Sample 22 | 1.6 | 0.03 | 0.04 |
| Invention Sample 23 | 1.6 | 0.03 | 0.04 |
| Invention Sample 24 | 1.4 | 0.06 | 0.07 |
| Invention Sample 25 | 1.6 | 0.03 | 0.04 |

The following cutting test was performed using the obtained samples (coated cutting tools). The results are shown in Table 18.

Cutting Test
Insert shape: CNGA120408
Work material: SCM420H (60HRC)
Work material shape: cylinder φ150 mm×300 mm
Cutting speed: 130 m/min
Feed: 0.15 mm/rev
Depth of cut: 0.15 mm
Coolant: used
Evaluation item: when a corner wear (VBc) reached 0.15 mm, it was defined as the tool life, and the machining time until the tool life was measured.

TABLE 18

| | Cutting test Machining time (min) |
|---|---|
| Invention Sample 20 | 195 |
| Invention Sample 21 | 192 |
| Invention Sample 22 | 188 |
| Invention Sample 23 | 203 |
| Invention Sample 24 | 189 |
| Invention Sample 25 | 209 |

In the cutting test, the machining time until the tool life of the invention products 20 to 25 was 188 minutes or longer.

The above results reveal that the tool life of the invention products is extended by improving the wear resistance and the fracture resistance.

INDUSTRIAL APPLICABILITY

The coated cutting tool of the present invention has a longer tool life than in the prior art, and therefore is industrially applicable.

REFERENCE SIGNS LIST

1: Substrate, 2: Lower layer, 3: Ti carbonitride layer, 4: Coating layer, 5: Coated cutting tool.

What is claimed is:

1. A coated cutting tool comprising a substrate comprising a cubic boron nitride sintered body and a coating layer formed on the substrate, wherein
the coating layer comprises a Ti carbonitride layer comprising a composition represented by a following formula (i), $$Ti(C_xN_{1-x}) \quad (i)$$

in the formula, x represents an atomic ratio of the C element to a total of the C element and the N element at a position where a thickness is 50% from the substrate side in the Ti carbonitride layer, and satisfies $0.1<x<0.5$;
an average thickness of the Ti carbonitride layer is 0.5 μm or more and 5.0 μm or less;
in the Ti carbonitride layer, an atomic ratio R75 of the C element to a total of the C element and the N element at a position where a thickness is 75% from the substrate side is higher than an atomic ratio R25 of the C element to a total of the C element and the N element at a position where a thickness is 25% from the substrate side;
in the Ti carbonitride layer, a texture coefficient TC (111) of a (111) plane represented by a following formula (1) is 1.0 or more and 2.0 or less; and
in X-ray diffraction measurement of the Ti carbonitride layer, an absolute value of a difference between a maximum value and a minimum value of 2θ represented by a following formula (2) is 0.1° or less on the (111) plane when the measurement is performed at each of ψ angles of 0°, 30°, 50° and 70°, $$TC(111) = \frac{I(111)}{I_0(111)} \left\{ \frac{1}{6} \Sigma \frac{I(hkl)}{I_0(hkl)} \right\}^{-1} \quad (1)$$

in the formula (1), I(hkl) represents a peak intensity of an (hkl) plane in X-ray diffraction of the Ti carbonitride layer, $I_0$(hkl) represents a standard diffraction intensity of the (hkl) plane in an ICDD card number 00-042-1488, and (hkl) indicates six crystal planes of (111), (200), (220), (311), (420), (422);

Absolute value of the difference between the maximum value and the minimum value of 2θ=|2θ max−2θ min| (2)

in the formula (2), 2θ max represents a maximum value among peak positions 2θ of a crystal plane when the ψ angle is 0°, 30°, 50°, and 70°, and 2θ min represents a minimum value among peak positions 2θ of the crystal plane when the ψ angle is 0°, 30°, 50°, and 70°.

2. The coated cutting tool according to claim 1, wherein in the X-ray diffraction measurement of the Ti carbonitride layer, an absolute value of a difference between a maximum value and a minimum value of 2θ represented by the formula (2) is 0.1° or less on a (200) plane when the measurement is performed at each of ψ angles of 0°, 30°, 50° and 70°.

3. The coated cutting tool according to claim 1, wherein in the Ti carbonitride layer, a difference (R75-R25) between the atomic ratio R75 of the C element to a total of the C element and the N element at a position where a thickness is 75% from the substrate side and the atomic ratio R25 of the C element to a total of the C element and the N element at a position where a thickness is 25% from the substrate side is 0.1 or more and 0.3 or less.

4. The coated cutting tool according to claim 1, wherein
the coating layer has a lower layer between the substrate and the Ti carbonitride layer;
the lower layer is
a single layer or a stack of layers of at least one selected from the group consisting of
a following metal layer:
the metal layer consisting of a metal element of at least one selected from the group consisting of Ti, Zr, Hf, V, Nb, Ta, Cr, Mo, W, Al, Si, and Y, and
a following compound layer:
the compound layer consisting of a metal element of at least one selected from the group consisting of Ti, Zr, Hf, V, Nb, Ta, Cr, Mo, W, Al, Si, and Y, and an element of at least one selected from the group consisting of C, N, O, and B; and
an average thickness of the lower layer is 0.1 μm or more and 5.0 μm or less.

5. The coated cutting tool according to claim 1, wherein
the coating layer has a lower layer between the substrate and the Ti carbonitride layer;
the lower layer has an alternating laminate structure in which a first compound layer having a composition represented by a following formula (I) and a second compound layer having a composition represented by a following formula (II) are alternately layered two or more times;
an average thickness of the first compound layer is 2 nm or more and 500 nm or less; and
an average thickness of the second compound layer is 2 nm or more and 500 nm or less, $$(Ti_yAl_{1-y})N \quad (I)$$

in the formula, y represents an atomic ratio of the Ti element to a total of the Ti element and the Al element, and satisfies $0.1 \leq y \leq 0.5$, $$(Ti_zAl_{1-z})N \quad (II)$$

in the formula, z represents an atomic ratio of the Ti element to a total of the Ti element and the Al element, and satisfies $0.5 \leq z \leq 0.8$.

6. The coated cutting tool according to claim 1, wherein an average thickness of the entire coating layer is 1.5 μm or more and 8.0 μm or less.

7. The coated cutting tool according to claim 2, wherein in the Ti carbonitride layer, a difference (R75-R25) between the atomic ratio R75 of the C element to a total of the C element and the N element at a position where a thickness is 75% from the substrate side and the atomic ratio R25 of the C element to a total of the C element and the N element at a position where a thickness is 25% from the substrate side is 0.1 or more and 0.3 or less.

8. The coated cutting tool according to claim 2, wherein
the coating layer has a lower layer between the substrate and the Ti carbonitride layer;

the lower layer is
a single layer or a stack of layers of at least one selected from the group consisting of
a following metal layer:
the metal layer consisting of a metal element of at least one selected from the group consisting of Ti, Zr, Hf, V, Nb, Ta, Cr, Mo, W, Al, Si, and Y, and
a following compound layer:
the compound layer consisting of a metal element of at least one selected from the group consisting of Ti, Zr, Hf, V, Nb, Ta, Cr, Mo, W, Al, Si, and Y, and an element of at least one selected from the group consisting of C, N, O, and B; and
an average thickness of the lower layer is 0.1 μm or more and 5.0 μm or less.

9. The coated cutting tool according to claim 3, wherein
the coating layer has a lower layer between the substrate and the Ti carbonitride layer;
the lower layer is
a single layer or a stack of layers of at least one selected from the group consisting of
a following metal layer:
the metal layer consisting of a metal element of at least one selected from the group consisting of Ti, Zr, Hf, V, Nb, Ta, Cr, Mo, W, Al, Si, and Y, and
a following compound layer:
the compound layer consisting of a metal element of at least one selected from the group consisting of Ti, Zr, Hf, V, Nb, Ta, Cr, Mo, W, Al, Si, and Y, and an element of at least one selected from the group consisting of C, N, O, and B; and
an average thickness of the lower layer is 0.1 μm or more and 5.0 μm or less.

10. The coated cutting tool according to claim 7, wherein
the coating layer has a lower layer between the substrate and the Ti carbonitride layer;
the lower layer is
a single layer or a stack of layers of at least one selected from the group consisting of
a following metal layer:
the metal layer consisting of a metal element of at least one selected from the group consisting of Ti, Zr, Hf, V, Nb, Ta, Cr, Mo, W, Al, Si, and Y, and
a following compound layer:
the compound layer consisting of a metal element of at least one selected from the group consisting of Ti, Zr, Hf, V, Nb, Ta, Cr, Mo, W, Al, Si, and Y, and an element of at least one selected from the group consisting of C, N, O, and B; and
an average thickness of the lower layer is 0.1 μm or more and 5.0 μm or less.

11. The coated cutting tool according to claim 2, wherein
the coating layer has a lower layer between the substrate and the Ti carbonitride layer;
the lower layer has an alternating laminate structure in which a first compound layer having a composition represented by a following formula (I) and a second compound layer having a composition represented by a following formula (II) are alternately layered two or more times;
an average thickness of the first compound layer is 2 nm or more and 500 nm or less; and
an average thickness of the second compound layer is 2 nm or more and 500 nm or less, $$(Ti_yAl_{1-y})N \quad (I)$$

in the formula, y represents an atomic ratio of the Ti element to a total of the Ti element and the Al element, and satisfies $0.1<y<0.5$, $$(Ti_zAl_{1-z})N \quad (II)$$

in the formula, z represents an atomic ratio of the Ti element to a total of the Ti element and the Al element, and satisfies $0.5 \le z \le 0.8$.

12. The coated cutting tool according to claim 3, wherein
the coating layer has a lower layer between the substrate and the Ti carbonitride layer;
the lower layer has an alternating laminate structure in which a first compound layer having a composition represented by a following formula (I) and a second compound layer having a composition represented by a following formula (II) are alternately layered two or more times;
an average thickness of the first compound layer is 2 nm or more and 500 nm or less; and
an average thickness of the second compound layer is 2 nm or more and 500 nm or less, $$(Ti_yAl_{1-y})N \quad (I)$$

in the formula, y represents an atomic ratio of the Ti element to a total of the Ti element and the Al element, and satisfies $0.1<y<0.5$, $$(Ti_zAl_{1-z})N \quad (II)$$

in the formula, z represents an atomic ratio of the Ti element to a total of the Ti element and the Al element, and satisfies $0.5 \le z \le 0.8$.

13. The coated cutting tool according to claim 4, wherein
the coating layer has a lower layer between the substrate and the Ti carbonitride layer;
the lower layer has an alternating laminate structure in which a first compound layer having a composition represented by a following formula (I) and a second compound layer having a composition represented by a following formula (II) are alternately layered two or more times;
an average thickness of the first compound layer is 2 nm or more and 500 nm or less; and
an average thickness of the second compound layer is 2 nm or more and 500 nm or less, $$(Ti_yAl_{1-y})N \quad (I)$$

in the formula, y represents an atomic ratio of the Ti element to a total of the Ti element and the Al element, and satisfies $0.1<y<0.5$, $$(Ti_zAl_{1-z})N \quad (II)$$

in the formula, z represents an atomic ratio of the Ti element to a total of the Ti element and the Al element, and satisfies $0.5 \le z \le 0.8$.

14. The coated cutting tool according to claim 7, wherein
the coating layer has a lower layer between the substrate and the Ti carbonitride layer;
the lower layer has an alternating laminate structure in which a first compound layer having a composition represented by a following formula (I) and a second compound layer having a composition represented by a following formula (II) are alternately layered two or more times;
an average thickness of the first compound layer is 2 nm or more and 500 nm or less; and an average thickness of the second compound layer is 2 nm or more and 500 nm or less, $$(Ti_yAl_{1-y})N \qquad (I)$$

in the formula, y represents an atomic ratio of the Ti element to a total of the Ti element and the Al element, and satisfies $0.1<y<0.5$, $$(Ti_zAl_{1-z})N \qquad (II)$$

in the formula, z represents an atomic ratio of the Ti element to a total of the Ti element and the Al element, and satisfies $0.5 \le z \le 0.8$.

15. The coated cutting tool according to claim 8, wherein the coating layer has a lower layer between the substrate and the Ti carbonitride layer;
the lower layer has an alternating laminate structure in which a first compound layer having a composition represented by a following formula (I) and a second compound layer having a composition represented by a following formula (II) are alternately layered two or more times;
an average thickness of the first compound layer is 2 nm or more and 500 nm or less; and
an average thickness of the second compound layer is 2 nm or more and 500 nm or less, $$(Ti_yAl_{1-y})N \qquad (I)$$

in the formula, y represents an atomic ratio of the Ti element to a total of the Ti element and the Al element, and satisfies $0.1<y<0.5$, $$(Ti_zAl_{1-z})N \qquad (II)$$

in the formula, z represents an atomic ratio of the Ti element to a total of the Ti element and the Al element, and satisfies $0.5 \le z \le 0.8$.

16. The coated cutting tool according to claim 9, wherein the coating layer has a lower layer between the substrate and the Ti carbonitride layer;
the lower layer has an alternating laminate structure in which a first compound layer having a composition represented by a following formula (I) and a second compound layer having a composition represented by a following formula (II) are alternately layered two or more times;
an average thickness of the first compound layer is 2 nm or more and 500 nm or less; and
an average thickness of the second compound layer is 2 nm or more and 500 nm or less, $$(Ti_yAl_{1-y})N \qquad (I)$$

in the formula, y represents an atomic ratio of the Ti element to a total of the Ti element and the Al element, and satisfies $0.1<y<0.5$, $$(Ti_zAl_{1-z})N \qquad (II)$$

in the formula, z represents an atomic ratio of the Ti element to a total of the Ti element and the Al element, and satisfies $0.5 \le z \le 0.8$.

17. The coated cutting tool according to claim 10, wherein the coating layer has a lower layer between the substrate and the Ti carbonitride layer;
the lower layer has an alternating laminate structure in which a first compound layer having a composition represented by a following formula (I) and a second compound layer having a composition represented by a following formula (II) are alternately layered two or more times;
an average thickness of the first compound layer is 2 nm or more and 500 nm or less; and
an average thickness of the second compound layer is 2 nm or more and 500 nm or less, $$(Ti_yAl_{1-y})N \qquad (I)$$

in the formula, y represents an atomic ratio of the Ti element to a total of the Ti element and the Al element, and satisfies $0.1<y<0.5$, $$(Ti_zAl_{1-z})N \qquad (II)$$

in the formula, z represents an atomic ratio of the Ti element to a total of the Ti element and the Al element, and satisfies $0.5 \le z \le 0.8$.

18. The coated cutting tool according to claim 2, wherein an average thickness of the entire coating layer is 1.5 μm or more and 8.0 μm or less.

19. The coated cutting tool according to claim 3, wherein an average thickness of the entire coating layer is 1.5 μm or more and 8.0 μm or less.

20. The coated cutting tool according to claim 4, wherein an average thickness of the entire coating layer is 1.5 μm or more and 8.0 μm or less.

* * * * *